(12) United States Patent
Melanson

(10) Patent No.: US 7,796,076 B2
(45) Date of Patent: Sep. 14, 2010

(54) TRANSFORMER-ISOLATED ANALOG-TO-DIGITAL CONVERTER (ADC) FEEDBACK APPARATUS AND METHOD

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 299 days.

(21) Appl. No.: 12/037,932

(22) Filed: Feb. 26, 2008

(65) Prior Publication Data
US 2009/0212759 A1    Aug. 27, 2009

(51) Int. Cl.
*H03M 1/12*    (2006.01)
(52) U.S. Cl. ........................ 341/155; 341/143
(58) Field of Classification Search .............. 341/143, 341/155
See application file for complete search history.

(56) References Cited

U.S. PATENT DOCUMENTS

| | | | |
|---|---|---|---|
| 5,206,540 | A | 4/1993 | de Sa e Silva et al. |
| 5,781,040 | A | 7/1998 | Myers |
| 5,900,683 | A | 5/1999 | Rinehart et al. |
| 5,952,849 | A | 9/1999 | Haigh |
| 6,407,691 | B1 | 6/2002 | Yu |
| 6,873,065 | B2 | 3/2005 | Haigh et al. |
| 7,003,023 | B2 | 2/2006 | Krone et al. |
| 7,050,509 | B2 | 5/2006 | Krone et al. |
| 7,075,329 | B2 | 7/2006 | Chen et al. |
| 7,078,963 | B1 | 7/2006 | Andersen et al. |
| 7,158,573 | B2 * | 1/2007 | Hershbarger ............ 375/258 |
| 2002/0150151 | A1 | 10/2002 | Krone et al. |
| 2004/0046683 | A1 | 3/2004 | Mitamura et al. |
| 2004/0232971 | A1 | 11/2004 | Kawasaki et al. |

FOREIGN PATENT DOCUMENTS

| EP | 1768257 | 3/2007 |
|---|---|---|
| EP | 1768257 A1 | 3/2007 |

(Continued)

OTHER PUBLICATIONS

U.S. Appl. No. 11/954,202, filed Dec. 11, 2007, Melanson.

(Continued)

*Primary Examiner*—Khai M Nguyen
(74) *Attorney, Agent, or Firm*—Andrew M. Harris; Mitch Harris, Atty at Law, LLC

(57) ABSTRACT

A transformer-isolated analog-to-digital converter (ADC) feedback apparatus and method provides reduction of circuit complexity in high power/high voltage systems having a transformer-isolated sensing circuit. The feedback apparatus is a circuit including an ADC for receiving an analog input signal and a transformer having a first winding that receives a modulated output of the analog-to-digital converter. A second winding of the transformer provides an isolated data output of the ADC. A demodulator is coupled to the second winding of the transformer and demodulates the isolated output to generate a digital representation of the analog input signal. The ADC may be a delta-sigma converter and the demodulator may be the corresponding decimation filter. The circuit further includes an isolation circuit for introducing a clock signal and/or power supply waveform at the second winding of the transformer, so that the ADC circuit is supplied with an isolated clock and/or an isolated power supply.

25 Claims, 7 Drawing Sheets

FOREIGN PATENT DOCUMENTS

| | | |
|---|---|---|
| GB | 2262673 | 6/1993 |
| GB | 2262673 A | 6/1993 |
| WO | WO91/13417 | 9/1991 |
| WO | WO 91/13417 * | 9/1991 |
| WO | WO97/42714 | 11/1997 |

OTHER PUBLICATIONS

AD7400 Datasheet, "Isolated Sigma-Delta Modulator", Analog Devices 2006.

BB3656 Datasheet "Transformer Coupled Isolation Amplifier", Burr-Brown 1987.

* cited by examiner

TRANSFORMER-ISOLATED ANALOG-TO-DIGITAL CONVERTER (ADC) FEEDBACK APPARATUS AND METHOD

BACKGROUND OF THE INVENTION

1. Field of the Invention

The present invention relates generally to power switching circuits having transformer isolation, and more specifically, to a method and apparatus that provide digital feedback from an analog-to-digital converter (ADC) through a transformer that supplies power and/or clock signals from a winding that is isolated from the ADC circuit.

2. Background of the Invention

Power switching circuits and other circuits that provide for control of and/or measurement of high power/high voltage systems typically require isolation of the high power/high voltage portion of the system from digital control and/or measurement circuits. A transformer is typically used to provide an isolation circuit in such systems. For sensing circuits, the local sensing circuit power supply is typically derived from the high power/high voltage side of the isolation circuit, or provided as a separate power supply. Additionally clock and control signals are generated or provided locally to the sensing circuit, if required. Circuits such as voltage-to-frequency (V/F) converters are frequently used for sensing in such applications, due to their low cost and lack of control/clock signal requirement.

However, in systems having digital control of high power/high voltage circuits, use of an ADC is desirable for sensing, with the consequent cost of additional clock and power supplies provided at the isolated (sensed) side of the transformer.

Therefore, it would be desirable to provide a transformer-isolated ADC circuit that does not require clock or power supply components at the isolated sensing side of the transformer.

SUMMARY OF THE INVENTION

The above stated objective of providing a transformer-isolated ADC circuit that requires no clock or power supply components at the sensing side of the transformer, is achieved in a transformer-isolated ADC circuit and its method of operation. The circuit may be provided by a transformer and a set of integrated circuits, one of which includes the ADC coupled to a first winding of the transformer, and the other of which provides digital measurement and/or control circuitry coupled to another winding of the transformer.

The circuit includes an ADC for receiving an analog input signal and a transformer having a first winding that receives a modulated output of the analog-to-digital converter. A second winding of the transformer provides an isolated data output of the ADC. A demodulator is coupled to the second winding of the transformer and demodulates the isolated output to generate a digital representation of the analog input signal. The demodulator may be a decimation filter if the ADC is a delta-sigma ADC and the quantizer output is coupled through the transformer as the data output from the transformer. Alternatively, a delta-sigma ADC along with a decimation filter may have a decimated output coupled to the transformer as modulated serial data, generally at a lower data rate.

The circuit further includes an isolation circuit for introducing a clock signal and/or a power supply waveform at the second winding of the transformer, so that the ADC circuit is supplied with an isolated clock and/or an isolated power supply.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses circuits and methods for providing power and/or clock signals to an analog-to-digital converter (ADC) circuit that is isolated from the rest of the circuitry by a transformer. The digital output of the ADC is transmitted from the ADC through the transformer, providing an isolated digital feedback signal for high-power/high-voltage applications. The ADC circuit may be a delta-sigma modulator-based ADC, and the modulator output may be provided to a first winding of the transformer, and the decimating filter coupled to a second winding of the transformer, so that the delta-sigma modulator provides the modulated signal that couples the output of the ADC through the transformer. Alternatively, the decimating filter may be coupled directly to the ADC circuit and the decimated output modulated for coupling through the transformer. Other types of ADC circuits may also alternatively be employed and their digital outputs modulated for providing the transformer-isolated signal to a winding of the transformer, which is then demodulated at another winding of the transformer. Control information can also be provided within the modulated signal, so that a single transformer may be used to operate circuits on the ADC side of the transformer such as power switching devices.

Figure 1:
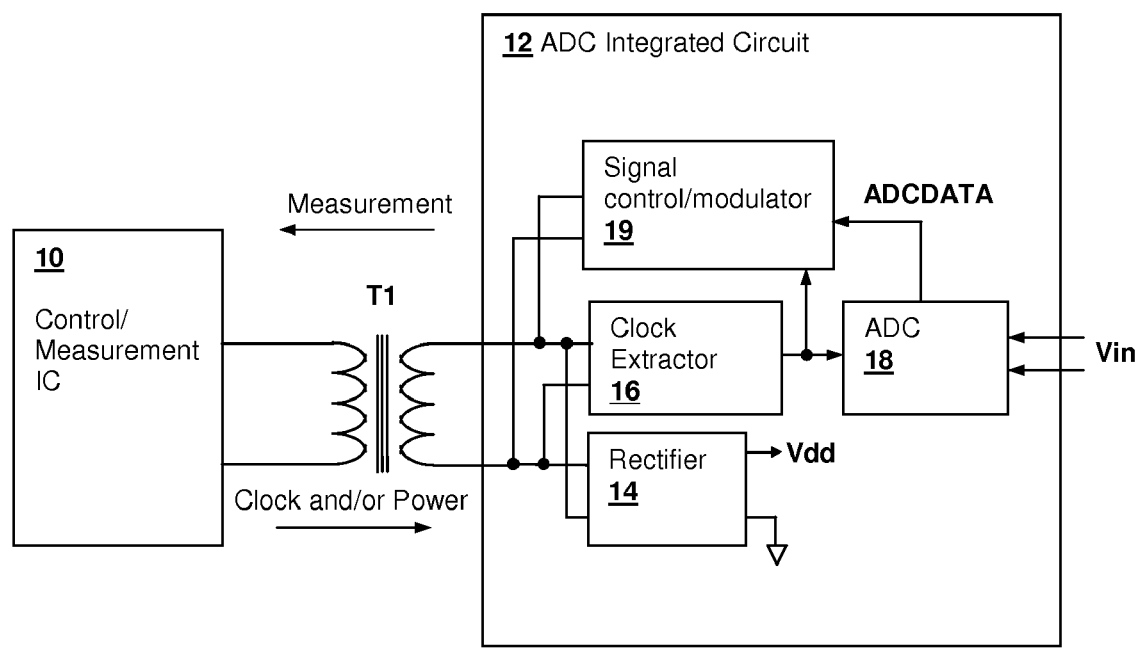
FIG. 1 is a block diagram depicting a circuit in accordance with an embodiment of the present invention.

Referring now to FIG. 1, a circuit in accordance with an embodiment of the invention is shown. A control/measurement integrated circuit (IC) 10 is coupled to an analog-to-digital converter (ADC) integrated circuit 12 by a transformer T1, which provides isolation between circuits within control/measurement integrated circuit (IC) 10 and devices to which ADC integrated circuit 12 is connected. Transformer T1 also isolates power supplies coupled to control/measurement integrated circuit (IC) 10 from devices to which ADC integrated circuit 12 is connected. Measurement data provided from ADC integrated circuit 12 is embedded in a modulated signal that carries the digital output information from an ADC circuit 18 through transformer T1 to control/measurement integrated circuit (IC) 10. Clock information and power is provided from control/measurement integrated circuit (IC) 10 through transformer T1 to operate ADC integrated circuit 12. A rectifier 14 within ADC integrated circuit 12 rectifies the AC waveform appearing on the secondary winding of transformer T1 that is connected to ADC integrated circuit 12. The rectifier 14 supplies power to internal circuits of ADC integrated circuit 12, but may also be used to power external devices, if needed. The primary winding of T1 is provided with AC power from control/measurement integrated circuit (IC) 10, except during periodic intervals during which data from ADC 18 is imposed on the secondary winding of transformer T1 by a signal control/modulator circuit 19.

A clock extractor circuit 16, which generally includes a phase-lock loop (PLL) or delay-lock loop (DLL), is used to generate a local clock signal for operating ADC 18 and signal control/modulator circuit 19, ensuring that ADC integrated circuit 12 and control/measurement integrated circuit (IC) 10 are synchronized. The synchronization permits control/measurement integrated circuit (IC) 10 to transmit clock information, power, and/or control information to ADC integrated circuit 12 while blanking transmission during intervals in which ADC integrated circuit 12 is providing digital measurement data to control/measurement integrated circuit (IC) 10.

Figure 2:
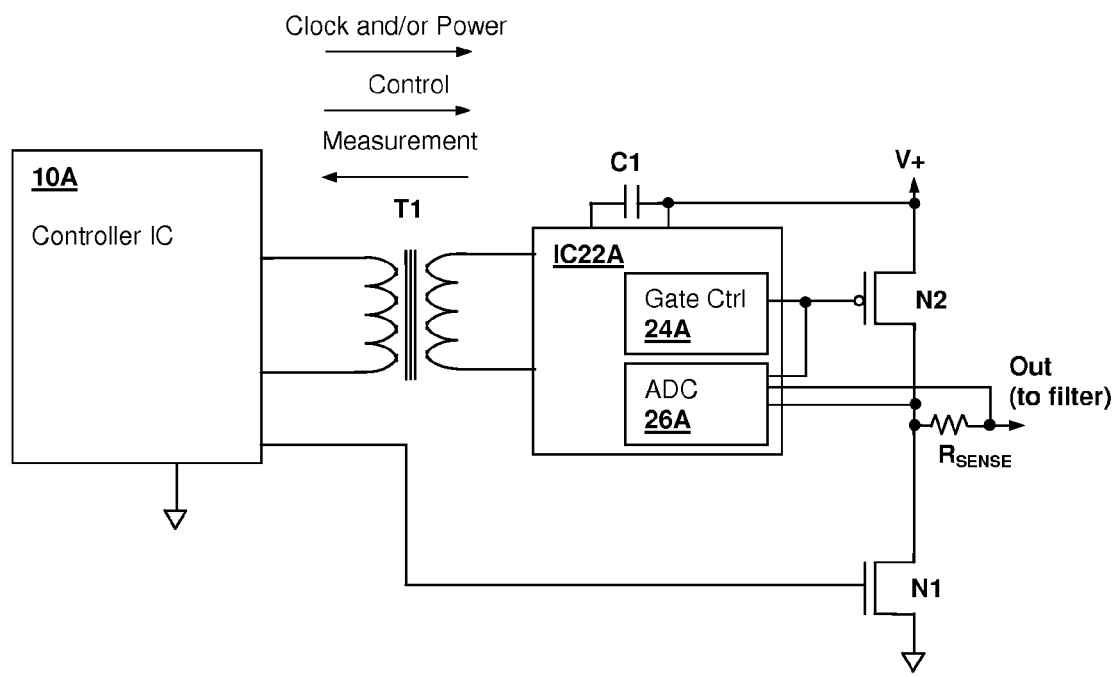
FIG. 2 is a detailed block diagram depicting a circuit in accordance with another embodiment of the present invention.

Referring now to FIG. 2, a circuit in accordance with another embodiment of the present invention is shown. The depicted embodiment is a power switching circuit that partially isolates a controller IC 10A from a switching power stage using transformer T1. As in the circuit of FIG. 1, clock information and power are provided from controller IC 10A to integrated circuit IC22A, and ADC output information is provided from integrated circuit IC22A to controller IC 10A. Control of the gate of switching transistor N1 is provided directly from controller IC 10A, but control of the gate of switching transistor N2, is provided from integrated circuit IC22A, which permits controller IC 10A to operate from a much lower power supply voltage and therefore use a lower voltage technology than would be required if controller IC 10A were configured to operate the gate of transistor N2 directly, i.e. without the isolation provided by transformer T1. Integrated circuit IC22A includes a gate control circuit 24A that extracts gate control information from the modulated waveform provided through transformer T1 from controller IC 10A. The power supply generated within integrated circuit IC22A is referenced to the output positive power supply rail, so that integrated circuit IC22A can also be implemented in low-voltage technology. The modulated signal provided by controller IC 10A to transformer T1 has information that is coded to provide gate drive control information to integrated circuit IC22A during a portion of the period of the modulated signal. An ADC circuit 26A provides information to controller IC 10A by providing digital output information that is combined in the modulated signal during intervals in which the output of controller IC 10A to transformer T1 is "blanked" (disabled).

Capacitor C1 filters the output of a rectifier circuit included in integrated circuit IC22A which is derived from the same winding of transformer T1 as the modulated clock/power/ADC information signal. The input to ADC 26A may be provided from one or more sources. If multiple sources are measured, ADC 26A will include a multiplexor/selector that may be operated by control information within the modulated signal in addition to the gate control information. Potential measurement sources include the current at switching power stage output Out of the switching power stage as determined by measuring the voltage across sense resistor $R_{SENSE}$ that is coupled in series with switching power state output Out. Either both voltages at the terminals of sense resistor $R_{SENSE}$ can be transmitted from ADC 26A to controller IC 10A, or a differential amplifier can be provided in integrated circuit 22A to provide an indication of the voltage across sense resistor to ADC 26A. ADC 26A may also select and measure the output voltage of the switching power stage and the voltage at the gate of transistor N2, permitting full characterization of the switching power output stage via measurements made by ADC 26A, which can be used as inputs to switching control circuits within controller IC 10A, as well as providing digital output to other devices for monitoring the status of the switching power stage.

Figure 3:
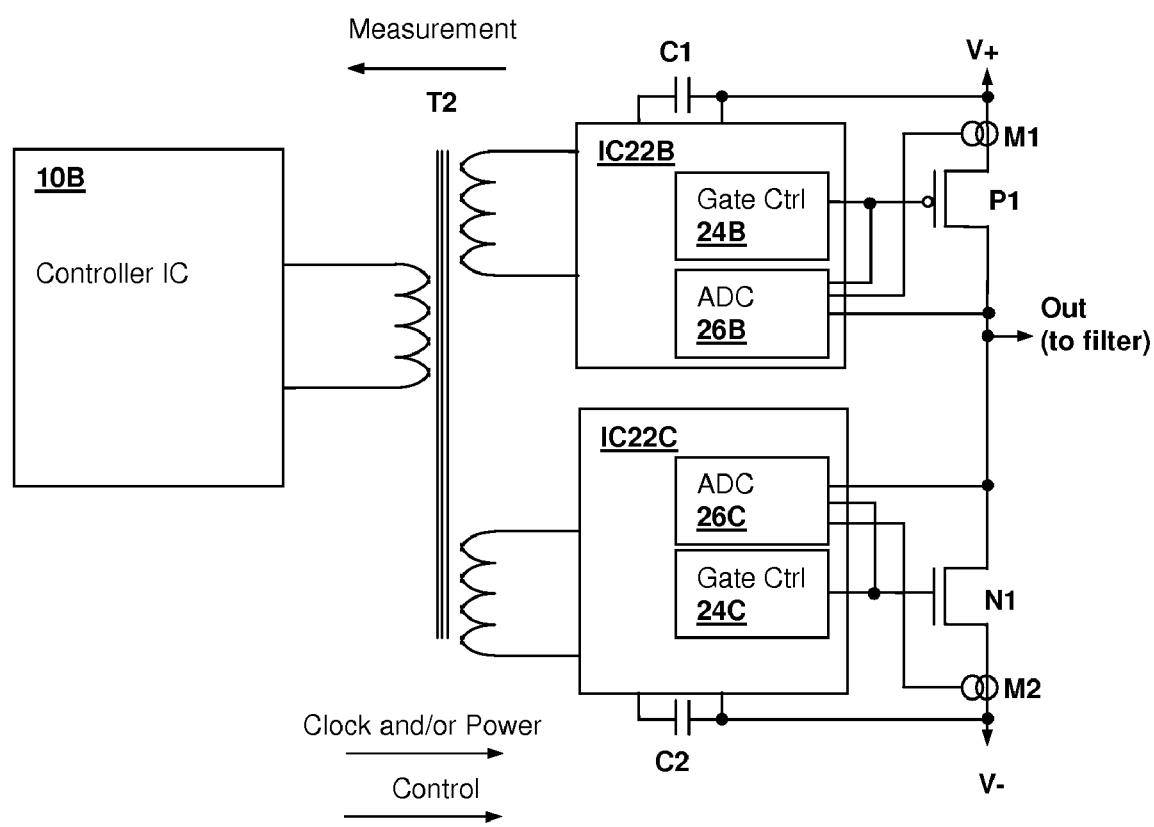
FIG. 3 is a detailed block diagram depicting a circuit in accordance with yet another embodiment of the present invention.

Referring now to FIG. 3, a circuit in accordance with another embodiment of the present invention is shown. The depicted embodiment is a power switching circuit that fully isolates a controller IC 10B from a switching power stage using transformer T2. The circuit of FIG. 3 is similar in operation and structure to the circuit of FIG. 2, and therefore only differences between them will be described below. As in the circuit of FIG. 2, clock information and power is provided from controller IC 10B to integrated circuits IC22B and IC22B, and ADC output information is provided from integrated circuits IC22B and IC22C to controller IC 10B. Integrated circuits IC22B and IC22C provide gate control signals to control switching power transistors P1 and N1, respectively. The power supply generated within integrated circuit IC22B is referenced to the output positive power supply rail, and similarly, the power supply within integrated circuit IC22C is referenced to the output negative power supply rail, so that both integrated circuits IC22B and IC22C can be implemented in low-voltage technology. The modulated control signal provided by controller IC 10C to transformer T2 has information that may be coded separately for integrated circuit IC22B and integrated circuit IC22C. The portions of the signal provided by ADC circuits 26B and 26C are each provided in separate intervals corresponding to the output of ADC circuits 26B and 26C during which the output of controller IC 10B to transformer T2 is blanked.

Capacitors C1 and C2 filter the outputs of rectifier circuits included in integrated circuits IC22B and IC22C which are derived from the same windings as the modulated clock/power/ADC information signal. Measurement sources provided to ADCs 26B and 26C include the current through transistors P1 and N1 as measured by corresponding current mirrors M1 and M2, the output voltage of the switching power stage and the voltage at the gates of each of transistors N1 and P1. One or more current-sensing resistors as illustrated in FIG. 2 may be employed as an alternative to current mirrors M1 and M2, and one or both of ADCs 26B and 26C can be used to measure the differential voltage across the sense resistor(s) to determine the current provided to the load and to sense any short-circuit current in the power switching output stage.

Figure 4:
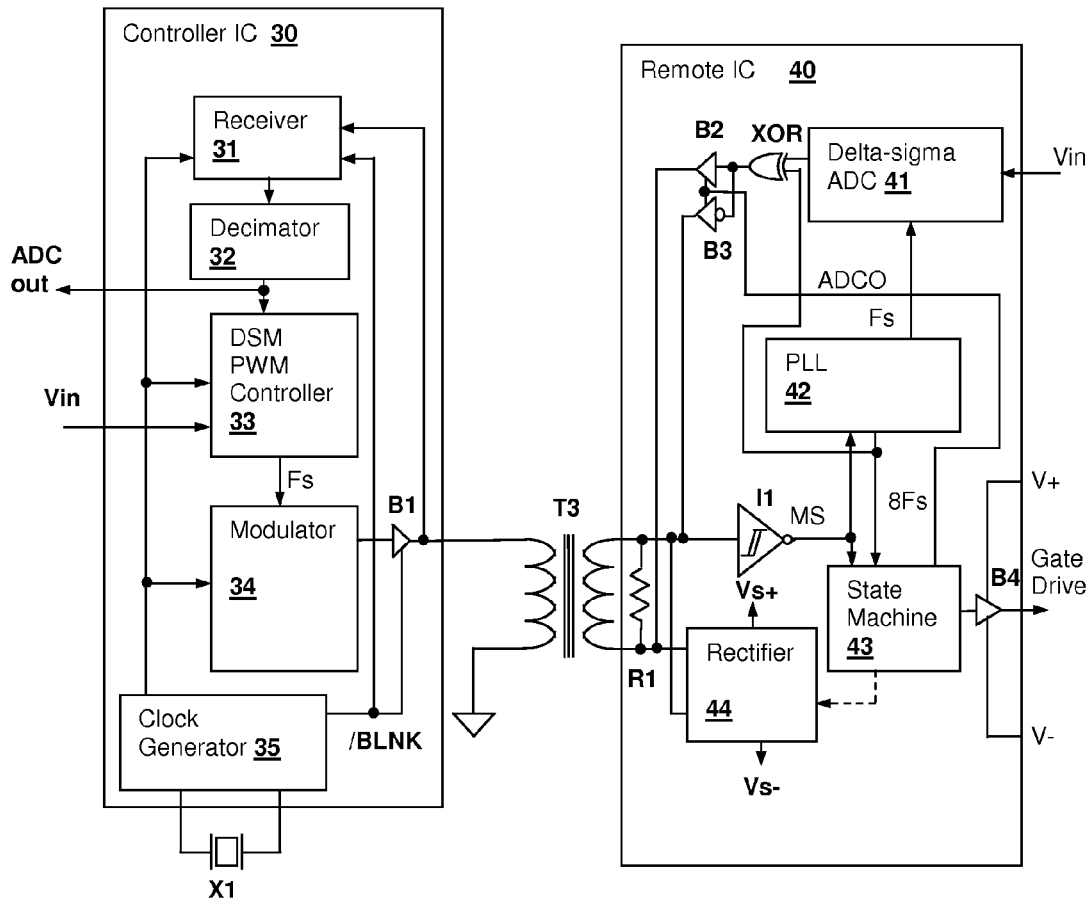
FIG. 4 is a detailed block diagram depicting a pair of interconnected integrated circuits in accordance with an embodiment of the present invention.

Referring now to FIG. 4, a "two chip" solution including a controller IC 30 and a remote IC 40 is shown in a block diagram detailing various components in accordance with an embodiment of the invention. Controller IC 30 includes a receiver 31 that detects ADC output bits embedded in the modulated signal present on a first winding of transformer T3 connected to controller IC 30. In the depicted embodiment, the ADC 41 is a one-bit delta-sigma ADC 41, and one bit per modulation period is transmitted from remote IC 40 to controller IC 30. A decimator 32 is included in controller IC 30 that accumulates the delta-sigma modulated ADC output and renders a digital output ADC out that can be used by control circuits within controller IC 30, such as delta-sigma modulator (DSM) based pulse-width modulator (PWM) controller 33 and/or provided as a measurement output. The configuration of FIG. 4 is advantageous as the modulation scheme is simple (insertion of one ADC bit per modulation period), and the complexity/power requirement of the ADC circuit 41 in remote IC 40 is reduced over a scheme in which the final ADC output is provided by remote IC 40. Buffers B2 and B3 are enabled by the output of a state machine 43 that synchronizes the interval (portion of the modulation period) in which controller IC 30 is enabled to receive ADC output data. Similarly, clock generator 35 in controller IC 30 generates a signal /BLNK which "blanks" the output of controller IC 35 provided to transformer T3 from modulator 34 when remote IC 40 is providing ADC output data. A logical exclusive-OR gate XOR provides a bipolar pulse that is either negative-positive or positive-negative, depending on the state of the output of delta-sigma ADC 41 for the period.

A rectifier circuit 44 provides power to circuits within remote IC 40 from the modulated waveform by either passive or active rectification, and rectifier 44 may be disabled during transmission of the ADC information if active rectification is employed. With either active or passive rectification, a substantial portion of the modulated waveform is provided by controller IC 30, so that sufficient power can be derived by rectifier 44 to operate all of the circuits within remote IC 40 and any external circuits to which power is supplied by remote IC 40. Schmidt Inverter I1 provides an input to state machine 43 and a phase-lock loop 42 so that clock and synchronization information is derived to operate delta-sigma ADC 41 and synchronize reception of control information used to control the Gate Drive signal provided to control an external switching transistor. The Gate Drive signal is provided through high voltage buffer B4, which has an input controlled by state machine 43. State machine 43 further controls application of the output of delta-sigma ADC circuit 41 in the modulated signal by enabling buffers B2 and B3. A resistor R1 provides a controlled load impedance at the output of transformer T3.

Within controller IC 30, DSM based PWM controller 33 provides an output to modulator 34 to set the pulse width of gate drive control information provided through transformer T3 to remote IC 40. Buffer B1 is enabled by clock generator circuit 35 during intervals in which information is not expected to be returned by remote IC 40. Modulator 34 thus provides clock information, gate control information, and power waveforms to remote IC 40 through transformer T3 when buffer B1 is enabled and receiver 31 receives data from delta-sigma ADC 41 in remote IC 40 when buffer B1 is disabled. The power and/or clock information may be provided by the portions of the signal passing through transformer T3 that carry gate drive control information from DSM-based PWM controller 33, or additional intervals for providing power and/or clock information may be provided within the signal carried by the transformer.

Figure 5:
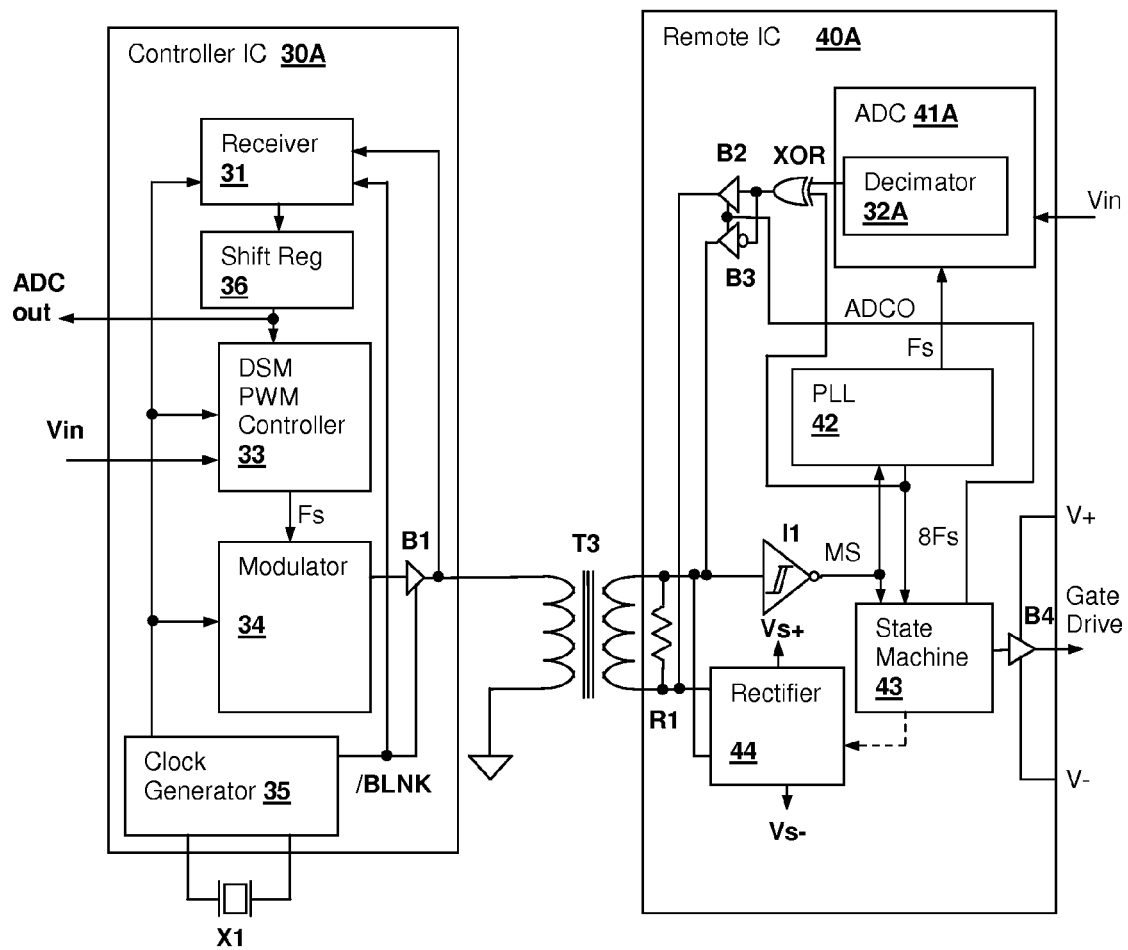
FIG. 5 is a detailed block diagram depicting a pair of interconnected integrated circuits in accordance with another embodiment of the present invention.

Referring now to FIG. 5, another "two chip" solution including a controller IC 30A and a remote IC 40A is shown in a block diagram detailing various components in accordance with another embodiment of the invention. The circuits of FIG. 5 are similar in structure and operation to those of FIG. 4, and therefore only the differences between then will be described below. Rather than providing a single bit output, ADC 41A in remote IC 40A includes a decimating filter or decimator 32A. In the depicted embodiment, a single decimator output bit per modulation period is transmitted through buffers B2 and B3, according to the same polarity inverting scheme provided by logical exclusive-OR gate XOR, however, other mechanisms may be employed for transmitting a serial output of decimator 32A. In any case, the ADC output rate of remote IC 40A is reduced over that of FIG. 4, with a consequent increase in complexity and power consumption. However, the circuit of FIG. 5 may be preferred in implementations where it is desirable to provide a burst of ADC data rather than a continuous single-bit DSM output, so that the modulated signal through transformer T3 is primarily used for control, with occasional transmission of ADC data back to controller IC 40A. Instead of a decimator, controller IC 40A includes a shift register 36 or other serial interface, to receive and decode the data provided from ADC 41A in remote IC 40A. Further, if ADC types other than delta-sigma ADCs are employed in remote IC 40A, the structure disclosed in FIG. 5 is directly applicable. For example, if ADC 41A is a flash-type ADC, then no decimator is generally required and serial data can be directly transmitted through transformer T3 for reception by controller IC 30A.

Figure 6:
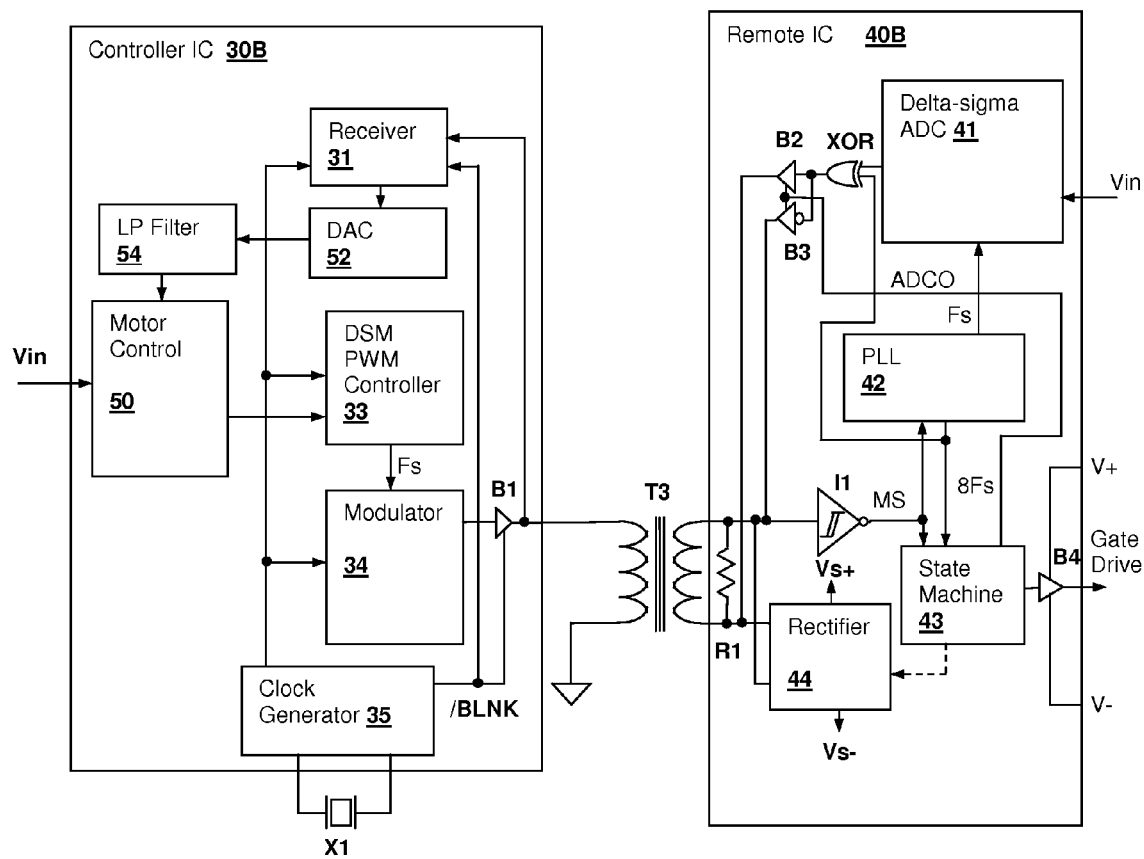
FIG. 6 is a detailed block diagram depicting a pair of interconnected integrated circuits in accordance with yet another embodiment of the present invention.

Referring now to FIG. 6, another "two chip" solution including a controller IC 30B and a remote IC 40B is shown in a block diagram detailing various components in accordance with another embodiment of the invention. The circuits of FIG. 6 are similar in structure and operation to those of FIG. 4, and therefore only the differences between them will be described below. In the depicted embodiment and as in the circuit of FIG. 4, a single decimator output bit per modulation period is transmitted from delta-sigma ADC 41 through buffers B2 and B3, according to the same polarity inverting scheme provided by logical exclusive-OR gate XOR. Instead of a decimator, controller IC 40B includes a digital-to-analog converter (DAC) 52 to receive the delta-sigma bitstream provided from ADC 41 in remote IC 40B. The output of DAC 52 is filtered by an analog low-pass filter 54 to remove the high-frequency component of the delta-sigma bitstream, providing an average voltage corresponding to the value measured by ADC 41, which may be, for example, the average current provided at the Gate Drive output. The output of low pass filter 54 is provided as a feedback signal, which in the exemplary embodiment is provided as an input to a motor control circuit 50, which is an analog circuit responsive to input voltage Vin and the feedback signal provided from low pass filter 54. The output of motor control circuit 50 is an analog input to DSM-based PWM controller 33, which provides control information through transformer T3 to control a motor coupled to the Gate Drive output. The illustrative example provides a closed-loop motor control system that can be made more responsive than a system including a decimator as part of the analog-to-digital converter path. While the illustrated embodiment shows a PWM based motor control solution, the circuit including DAC 52 and low pass filter 54 may be used in other implementations, such as systems in which control of motors or other devices is provided by paths other than through transformer T3, including systems in which transformer T3 provides only clock and/or power to a remote ADC integrated circuit and returns only the delta-sigma measurement bitstream.

Figure 7:
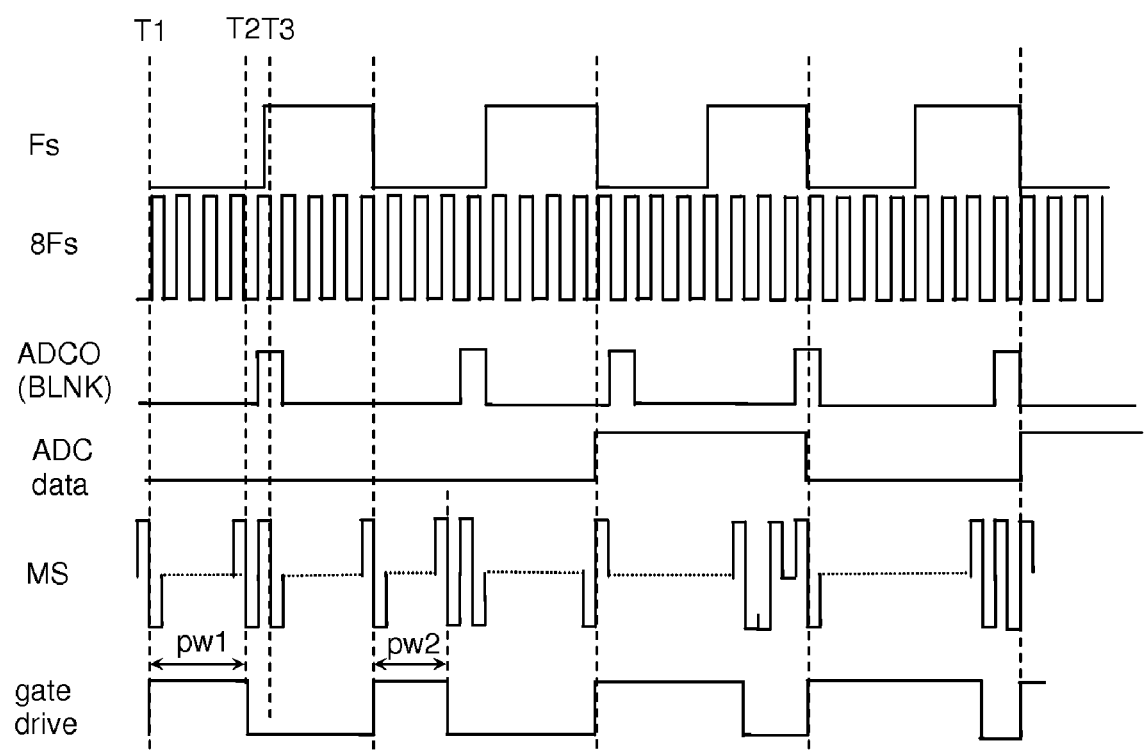
FIG. 7 is a timing diagram depicting signals within the circuits depicted in FIG. 1 through FIG. 6.

Referring now to FIG. 7, a timing diagram is depicted, showing signal relationships within the above-described circuits. Clock signal 8Fs shows a signal as may be reconstructed by a phase-lock loop or delay-lock loop at an ADC integrated circuit connected to a primary transformer winding, with a PWM control circuit operating at a sample rate illustrated by signal Fs that is connected to a secondary winding of the transformer. Signal ADCO and substantially identical signal BLANK are active when the output of the ADC is enabled, e.g., when the output of the PWM control circuit is blanked. Signal MS is the signal present on the transformer windings, and in the exemplary form, consists of a triplet of bipolar pulses per sampling period. The first pulse is at a fixed position, represented by time T1 and regular intervals thereafter and can be used to synchronize a clock extraction PLL/DLL circuit at the ADC. The first bipolar pulse is generated by the PWM control circuit (or other clock circuit if a PWM control circuit and associated gate drive are not present as in the circuit of FIG. 1). The second bipolar pulse is also generated by the PWM control circuit (or other clock circuit) and indicates the falling edge of the gate drive signal. Therefore, the time between the internal edge of the first bipolar pulse and the internal edge of the second bipolar pulse controls the pulse width, e.g., pw1, pw2 of the gate drive signal.

The third bipolar pulse is active during the assertion of the ADCO signal, and is generated by the ADC. The leading edge of the third bipolar pulse is started after completion of the second bipolar pulse and the polarity of the edge between the halves of the third bipolar pulse is set by the ADC data signal value, so that the edge polarity indicates either a single-bit ADC quantizer sample, or a bit of the decimated ADC value if the decimator is included within the ADC circuit. Additional pulses may be included to represent additional quantizer bits or to transmit a longer portion of the decimated ADC value in a given period. The illustrated waveforms show one technique that can be used for bidirectional transmission of data, while maintaining a net zero magnetization on the transformer. Other modulation techniques and bit patterns may be used, including encoding the control information at a higher clock rate, using pulse width changes to indicate the beginning and end of the gate drive signal, and techniques in which the frequency of the ADC sample rate is allowed to change to accommodate a wider range of control pulse widths.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit, comprising:
   an analog-to-digital converter for receiving an analog input signal;
   a transformer having at least one first winding for receiving a modulated output of the analog-to-digital converter and at least one second winding for providing an isolated data output;
   a demodulator coupled to the at least one second winding of the transformer for demodulating the isolated output to generate a digital representation of the analog input signal;
   an isolation circuit coupled to the at least one second winding of the transformer for coupling at least one of a clock signal or power supply through the transformer to the analog-to-digital converter, whereby the analog-to-digital converter is supplied with at least one of an isolated clock or an isolated power supply; and
   a switching power stage control circuit having a modulator output coupled to the at least one second winding for providing an isolated drive signal at the at least one first winding, wherein the modulator output has a rate substantially higher than the switching power stage control circuit control rate;
   another demodulator having an input coupled to the first winding of the transformer for demodulating the isolated drive signal; and
   a switching transistor having a gate coupled to an output of the another demodulator, whereby the switching transistor is controlled at the switching power stage control rate.

2. The circuit of claim 1, wherein the isolation circuit applies an alternating current at the at least one second winding of the transformer and wherein the analog-to-digital conversion circuit further comprises a rectifier for rectifying a voltage impressed on the at least one first winding by the isolation circuit to provide the isolated power supply to the analog-to-digital converter.

3. The circuit of claim 2, wherein the isolation circuit further applies a clock signal at the at least one second winding of the transformer, and wherein the analog-to-digital conversion circuit further comprises a clock extraction circuit coupled to the at least one first winding for providing the isolated clock to the analog-to-digital converter by extracting the clock signal from the at least one first winding.

4. The circuit of claim 1, wherein the isolation circuit applies a clock signal at the at least one second winding of the transformer and wherein the analog-to-digital conversion circuit further comprises a clock extraction circuit coupled to the at least one first winding for providing the isolated clock to the analog-to-digital converter by extracting the clock signal from the at least one first winding.

5. The circuit of claim 1, wherein the analog-to-digital converter comprises a delta-sigma modulator, and wherein the modulated output of the analog-to-digital converter is an output of a quantizer of the delta-sigma modulator and wherein the demodulator includes a decimator that decimates the isolated data output.

6. The circuit of claim 1, wherein the analog-to-digital converter comprises a delta-sigma modulator, and wherein the modulated output of the analog-to-digital converter is a data stream provided by a decimation filter of the analog-to-digital converter having an output coupled to the at least one first winding.

7. The circuit of claim 1, wherein the analog-to-digital converter comprises a delta-sigma modulator, and wherein the modulated output of the analog-to-digital converter is an output of a quantizer of the delta-sigma modulator and wherein the demodulator is coupled to a digital-to-analog converter for providing an analog output indicative of a value of the analog input signal.

8. A method for measuring an analog input signal, comprising:
   converting the analog input signal to digital values using an analog-to-digital converter circuit;
   first providing the digital values as modulated information to a first winding of a transformer;
   demodulating the modulated information at a second winding of the transformer;
   second providing at least one of a clock signal or a power supply waveform to the second winding of the transformer;
   receiving at least one of the clock signal or the power supply waveform at the first winding of the transformer;
   supplying the received clock signal or power supply waveform to the analog-to-digital converter circuit, whereby the analog-to-digital converter circuit is provided with at least one of operational clock or power;
   providing a modulated switching power stage control signal at the second winding of the transformer having a rate substantially higher than a control rate of a switching power stage; and
   demodulating the modulated switching power stage control signal at the first winding of the transformer to generate a control signal for the switching power stage.

9. The method of claim 8, wherein the second providing provides the power supply waveform and the receiving receives the power supply waveform, and wherein the method further comprises rectifying the power supply waveform to provide operational power to the analog-to-digital converter circuit.

10. The method of claim 9, wherein the second providing further provides the clock signal and the receiving receives the clock signal, and wherein the method further comprises extracting the clock signal from a signal at the first winding of the transformer and supplying clock information to the analog-to-digital converter circuit in conformity with the clock signal.

11. The method of claim 8, wherein the second providing provides the clock signal and the receiving receives the clock signal, and
wherein the method further comprises extracting the clock signal from a signal at the first winding of the transformer and supplying clock information to the analog-to-digital converter circuit in conformity with the clock signal.

12. The method of claim 8, wherein the analog-to-digital converter circuit comprises a delta-sigma modulator, and wherein the first providing provides output values of a quantizer of the delta-sigma modulator to the first winding of the transformer, and wherein the receiving further comprises decimating the output values of the transformer that are received at the first winding of the transformer.

13. The method of claim 8, wherein the analog-to-digital converter circuit comprises a delta-sigma modulator, wherein the method further comprises decimating the output of a quantizer of the delta-sigma modulator, and wherein the first providing provides a result of the decimating to the first winding of the transformer.

14. The method of claim 8, wherein the analog-to-digital converter circuit comprises a delta-sigma modulator, and wherein the first providing provides output values of a quantizer of the delta-sigma modulator to the first winding of the transformer, and wherein the method further comprises converting the output values that are received at the first winding of the transformer to an analog output signal indicative of a value of the analog input signal.

15. An integrated circuit, comprising:
a pair of terminals for connection to a second winding of a transformer having digital output information from an analog-to-digital converter integrated circuit connected to a first winding of the transformer;
a modulator for generating at least one of a power waveform or a clock waveform, wherein the output of the modulator is coupled to the pair of terminals for supplying the at least one power waveform or clock waveform to the analog-to-digital converter by coupling the at least one power waveform or clock waveform through the transformer; and
a switching power stage control circuit having an output coupled to the modulator for further providing modulated switching power stage control information to the pair of terminals for controlling a switching power stage coupled to analog-to-digital converter integrated circuit.

16. An integrated circuit, comprising:
an analog-to-digital converter circuit;
a pair of terminals for connection to a first winding of a transformer and coupled to an output of the analog-to-digital converter circuit for providing digital values to a receiver integrated circuit connected to a second winding of the transformer; and
a clock or power reception circuit for deriving at least one of a clock signal or power from the first winding of the transformer and having an output coupled to the analog-to-digital converter circuit for providing at least one of power or clock information to the analog-to-digital converter circuit;
a switching power stage control demodulator having an input coupled to the pair of terminals for decoding modulated switching power stage control information provided by the receiver integrated circuit; and
at least one switching power stage output terminal coupled to an output of the switching power stage control demodulator for providing a switching power control signal to at least one power switching device.

17. The integrated circuit of claim 16, further comprising a rectifier having an input coupled to the pair of terminals and an output coupled to a power supply input of the analog-to-digital converter circuit for providing power to the analog-to-digital converter circuit.

18. The integrated circuit of claim 17, further comprising a clock extractor circuit having an input coupled to the pair of terminals and an output coupled to a clock input of the analog-to-digital converter circuit for providing clock information to the analog-to-digital converter circuit.

19. The integrated circuit of claim 16, further comprising a clock extractor circuit having an input coupled to the pair of terminals and an output coupled to a clock input of the analog-to-digital converter circuit for providing clock information to the analog-to-digital converter circuit.

20. A circuit, comprising:
an analog-to-digital converter for receiving an analog input signal;
a transformer having at least one first winding for receiving a modulated output of the analog-to-digital converter and at least one second winding for providing an isolated data output;
a demodulator coupled to the at least one second winding of the transformer for demodulating the isolated output to generate a digital representation of the analog input signal; and
an isolation circuit coupled to the at least one second winding of the transformer for coupling at least one of a clock signal or power supply through the transformer to the analog-to-digital converter, whereby the analog-to-digital converter is supplied with at least one of an isolated clock or an isolated power supply, wherein the analog-to-digital converter comprises a delta-sigma modulator, and wherein the modulated output of the analog-to-digital converter is an output of a quantizer of the delta-sigma modulator and wherein the demodulator includes a decimator that decimates the isolated data output.

21. A circuit, comprising:
an analog-to-digital converter for receiving an analog input signal;
a transformer having at least one first winding for receiving a modulated output of the analog-to-digital converter and at least one second winding for providing an isolated data output;
a demodulator coupled to the at least one second winding of the transformer for demodulating the isolated output to generate a digital representation of the analog input signal; and
an isolation circuit coupled to the at least one second winding of the transformer for coupling at least one of a clock signal or power supply through the transformer to the analog-to-digital converter, whereby the analog-to-digital converter is supplied with at least one of an isolated clock or an isolated power supply, wherein the analog-to-digital converter comprises a delta-sigma modulator, and wherein the modulated output of the analog-to-digital converter is a data stream provided by a decimation filter of the analog-to-digital converter having an output coupled to the at least one first winding.

22. A circuit, comprising:
an analog-to-digital converter for receiving an analog input signal;
a transformer having at least one first winding for receiving a modulated output of the analog-to-digital converter and at least one second winding for providing an isolated data output;
a demodulator coupled to the at least one second winding of the transformer for demodulating the isolated output to generate a digital representation of the analog input signal; and
an isolation circuit coupled to the at least one second winding of the transformer for coupling at least one of a clock signal or power supply through the transformer to the analog-to-digital converter, whereby the analog-to-digital converter is supplied with at least one of an isolated clock or an isolated power supply, wherein the analog-to-digital converter comprises a delta-sigma modulator, and wherein the modulated output of the analog-to-digital converter is an output of a quantizer of the delta-sigma modulator and wherein the demodulator is coupled to a digital-to-analog converter for providing an analog output indicative of a value of the analog input signal.

23. A method for measuring an analog input signal, comprising:
converting the analog input signal to digital values using an analog-to-digital converter circuit;
first providing the digital values as modulated information to a first winding of a transformer;
demodulating the modulated information at a second winding of the transformer;
second providing at least one of a clock signal or a power supply waveform to the second winding of the transformer;
receiving at least one of the clock signal or the power supply waveform at the first winding of the transformer; and
supplying the received clock signal or power supply waveform to the analog-to-digital converter circuit, whereby the analog-to-digital converter circuit is provided with at least one of operational clock or power, wherein the analog-to-digital converter circuit comprises a delta-sigma modulator, and wherein the first providing provides output values of a quantizer of the delta-sigma modulator to the first winding of the transformer, and wherein the receiving further comprises decimating the output values of the transformer that are received at the first winding of the transformer.

24. A method for measuring an analog input signal, comprising:
converting the analog input signal to digital values using an analog-to-digital converter circuit;
first providing the digital values as modulated information to a first winding of a transformer;
demodulating the modulated information at a second winding of the transformer;
second providing at least one of a clock signal or a power supply waveform to the second winding of the transformer;
receiving at least one of the clock signal or the power supply waveform at the first winding of the transformer; and
supplying the received clock signal or power supply waveform to the analog-to-digital converter circuit, whereby the analog-to-digital converter circuit is provided with at least one of operational clock or power, wherein the analog-to-digital converter circuit comprises a delta-sigma modulator, wherein the method further comprises decimating the output of a quantizer of the delta-sigma modulator, and wherein the first providing provides a result of the decimating to the first winding of the transformer.

25. A method for measuring an analog input signal, comprising:
converting the analog input signal to digital values using an analog-to-digital converter circuit;
first providing the digital values as modulated information to a first winding of a transformer;
demodulating the modulated information at a second winding of the transformer;
second providing at least one of a clock signal or a power supply waveform to the second winding of the transformer;
receiving at least one of the clock signal or the power supply waveform at the first winding of the transformer; and
supplying the received clock signal or power supply waveform to the analog-to-digital converter circuit, whereby the analog-to-digital converter circuit is provided with at least one of operational clock or power, wherein the analog-to-digital converter circuit comprises a delta-sigma modulator, and wherein the first providing provides output values of a quantizer of the delta-sigma modulator to the first winding of the transformer, and wherein the method further comprises converting the output values that are received at the first winding of the transformer to an analog output signal indicative of a value of the analog input signal.

* * * * *